(12) United States Patent
Curello

(10) Patent No.: US 6,503,844 B2
(45) Date of Patent: Jan. 7, 2003

(54) NOTCHED GATE CONFIGURATION FOR HIGH PERFORMANCE INTEGRATED CIRCUITS

(75) Inventor: Giuseppe Curello, Catania (IT)

(73) Assignee: Infineon Technologies, AG, Munich (DE)

( * ) Notice: Subject to any disclaimer, the term of this patent is extended or adjusted under 35 U.S.C. 154(b) by 6 days.

(21) Appl. No.: 09/875,320

(22) Filed: Jun. 6, 2001

(65) Prior Publication Data

US 2002/0187646 A1 Dec. 12, 2002

(51) Int. Cl.[7] ............................................. H01L 21/302
(52) U.S. Cl. ...................... 438/710; 438/712; 438/718; 438/720; 438/721
(58) Field of Search ................................. 438/710, 712, 438/718, 720, 721, 723, 724, 739

(56) References Cited

U.S. PATENT DOCUMENTS 6,194,784 B1 * 2/2001 Parat et al. ................. 257/774
6,198,144 B1 * 3/2001 Pan et al. .................... 257/412
6,380,008 B2 * 4/2002 Kwok et al. ................ 257/303
6,380,035 B1 * 4/2002 Sung et al. ............. 257/29.129
6,423,632 B1 * 7/2002 Samavedam et al. ....... 438/652
6,436,805 B1 * 8/2002 Trivedi ....................... 438/618
6,437,377 B1 * 8/2002 Ajmera et al. .............. 257/204

* cited by examiner

Primary Examiner—Benjamin L. Utech
Assistant Examiner—Binh X. Tran
(74) Attorney, Agent, or Firm—Slater & Matsil, L.L.P.

(57) ABSTRACT

A notched gate configuration for high performance integrated circuits. The method of producing the notched gate configuration comprises forming a dielectric substrate and depositing a gate oxide layer, a conductive film layer, and a metal silicide layer over the gate oxide layer to form a conductive stack. A patterned silicon nitride mask layer is deposited over the conductive stack and over-etched to form a small notch in the metal silicide layer at each side of the patterned silicon nitride mask layer. This over-etching causes indentions to form in the conductive stack to result in decreased gate overlap between the gate and a source and drain which are later formed.

9 Claims, 3 Drawing Sheets

NOTCHED GATE CONFIGURATION FOR HIGH PERFORMANCE INTEGRATED CIRCUITS

TECHNICAL FIELD OF THE INVENTION

This invention relates generally to high performance integrated circuits, and more particularly, to a notched gate integrated circuit configuration to reduce gate overlap capacitance.

BACKGROUND OF THE INVENTION

Integrated circuit devices used in logic products, embedded DRAM (eDRAM), and future generation commodity DRAM technologies call for a continuous improvement of both transistor and circuit performances that are affected by various analog parameters. In particular, analog parameters such as parasitic capacitances are recognized as detrimental factors to the proper functioning of integrated circuits. The switching speed of logic gates in metal oxide semiconductor (MOS) integrated circuits is limited by the time required to charge and discharge the capacitances between device electrodes and between interconnecting lines and ground.

At the circuit level, the propagation delay is normally limited by the interconnection-line capacitances. At the device level, many parasitic capacitances are normally present in conventional complimentary metal oxide semiconductor (CMOS) transistors and the load capacitance $C_L$ is generally defined by the equation:

$$C_L = C_g + C_{ovl} + C_j + C_i,$$

where $C_g$=gate capacitance, $C_{ovl}$=overlap capacitance, $C_j$=junction capacitance, and $C_i$=interconnect capacitance. The load capacitance $C_L$ can dramatically affect the overall performance of the circuit by increasing the gate delay $\tau$ ($\tau = C_L \times V_{dd}/I_d$, where $V_{dd}$ is the operating Voltage and $I_d$ is the driving current).

In previous technologies the use of relatively thick (>10 nm) gate oxides ($G_{ox}$) and limited use of low dose HALO implants resulted in acceptable low values of $C_{ovl}$ and $C_j$, thus the load capacitance $C_L$ was low. Gate delay improvement was mainly achieved by gate shrinking and increasing $I_d$. Virtually no load capacitance engineering was performed other than, when possible, the use of materials with low dielectric constant ∈ for spacer fabrication (i.e. using oxide instead of nitride). ∈ is the dielectric constant of the material that is between the capacitor electrodes. As can be seen from the equation C=∈×A/t, where C=capacitance, A=area of capacitor, and t=thickness of the dielectric layer, the lower the value of ∈, the lower the capacitance C.

However, in current technologies load capacitance engineering is needed because the thickness of the $G_{ox}$ is decreased to increase the driving current $I_d$ and strong HALO implants are needed to decrease short channel effect (SCE) occurring at short gate lengths (generally already at gate lengths<0.3–0.5 um). SCE is a decreased threshold voltage $V_t$ that is undesirable because it is desired that $V_t$ remain constant regardless of channel length.

To compensate for SCE, strong HALO implants are utilized to push the lateral regions of the source and drain outside the gate. This effectively lengthens the channel to ensure that $V_t$ does not decrease. It provides, secondarily, for a reduced $C_{ovl}$, but does so at the expense of increasing another component of the load capacitance, the junction capacitance $C_j$. Halo implants also introduce extra processing steps that further add to the complexity and costs of manufacturing a semiconductor device.

SUMMARY OF THE INVENTION

These and other problems are generally solved or circumvented, and technical advantages are generally achieved, by the present invention that is a structure having a notched gate configuration and a method for producing the same.

In a preferred embodiment structure of the present invention, the semiconductor structure comprises a dielectric substrate, a gate electrode having indentions at each side of the gate electrode, a sidewall around a lower portion of the gate electrode, a spacer formed around the gate electrode, and a source and drain electrode.

A preferred method of forming an semiconductor device having a notched gate configuration comprises forming a dielectric substrate, depositing a gate oxide layer atop the dielectric substrate, depositing a conductive film layer atop the gate oxide and a metal silicide layer over the conductive film layer, the deposition of the metal silicide layer forming a conductive stack. The method further comprises depositing a patterned silicon nitride mask layer over the conductive stack, over-etching the patterned silicon nitride mask layer whereby a small notch is formed in the metal silicide layer at each side of the patterned silicon nitride mask layer, and etching the conductive stack down to the gate oxide layer; the small notch at each side of the patterned silicon nitride mask layer causing indentions to form in the conductive stack at the sides of the conductive film layer. The process continues with the forming of an oxide sidewall, the oxide sidewall encompassing the conductive film and gate oxide layers, the oxide sidewall conforming to the shape of the indentions, the forming a spacer around the silicon nitride mask layer and conductive stack, and forming a source and a drain in the dielectric substrate whereby the indentions in the conductive stack result in decreased gate overlap between the gate and the source and drain.

One advantage of a preferred embodiment of the present invention is that it decreases the gate overlap resulting in a smaller overall load capacitance.

Another advantage of a preferred embodiment of the present invention is that smaller gate lengths are achieved (i.e. the gate length is shorter at the bottom of the gate stack, thus a smaller device and higher performances) without extra lithography effort and cost.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the concepts and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF THE PREFERRED EMBODIMENTS

The making and using of the presently preferred embodiment is discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Although the present invention will be discussed in the context of CMOS integrated circuit applications, it should be appreciated by those skilled in the art that the present invention may be utilized in other applications.

Figure 1:
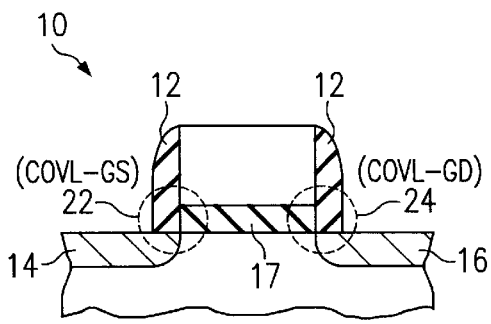
FIG. 1 illustrates the gate overlap that results in an increase in parasitic capacitances.

FIG. 1 illustrates the gate overlap that results in an increase in parasitic capacitances in CMOS integrated circuits. Semiconductor device 10 comprises a gate 12, source 14, and drain 16. During processing of the device 10, the diffusion of material into a wafer to form the source 14 and drain 16 results in an overlap of the source 14 with the gate 12 and an overlap of the drain 16 with the gate 12. The overlap of the source 14 and gate 12 is designated as left region 22 and the overlap of the drain 16 and gate 12 is designated right region 24. The left and right regions, 22 and 24, produce an overlap capacitance, $C_{ovl}$–GS and $C_{ovl}$–GD, respectively. These capacitances, $C_{ovl}$–GS and $C_{ovl}$–GD, will undesirably increase the overall load capacitance.

Figure 2A:
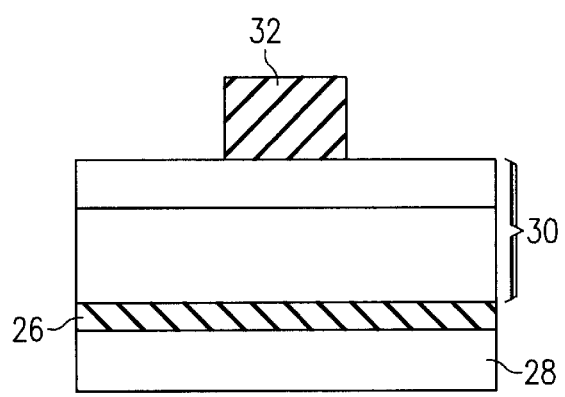
FIGS. 2A–2C illustrate a prior art method of processing a semiconductor device gate.
Figure 2B:
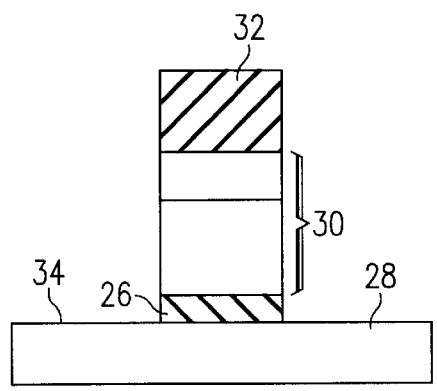
Figure 2C:
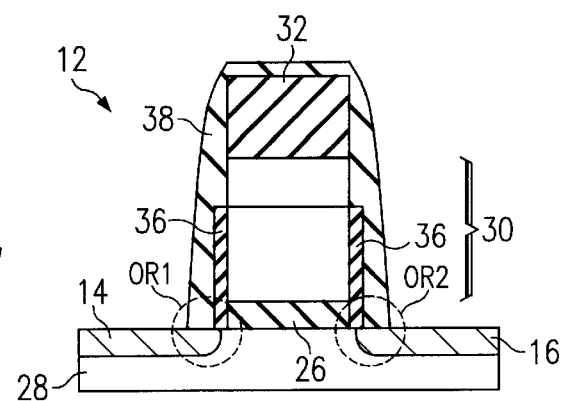

FIGS. 2A–2C illustrate a prior art method of processing the semiconductor device gate 12, source 14, and drain 16. As shown in FIG. 2A, the conventional prior art method deposits a gate oxide 26 onto a silicon substrate 28. A polysilicon and tungsten silicide stack 30 is deposited atop the gate oxide 26 to serve as an electrode for the device. A patterned nitride mask layer 32 is deposited onto the polysilicon and tungsten silicide stack 30 and etched to result in the device. The process continues with the polysilicon and tungsten silicide stack 30, and gate oxide 26 being etched to form a column of layers on the top surface 34 of the silicon substrate 28 as shown in FIG. 2B. FIG. 2C illustrates the completed gate 12 after a sidewall 36 and spacer 38 have been formed and the source 14 and drain 16 have been formed in the silicon substrate 28. As discussed in FIG. 1, the drain 16 and source 14 overlap the gate 12. Overlapping regions, OR1 and OR2, are shown in FIG. 2C. OR1 and OR2 produce the overlap capacitance. This overlap capacitance increases the overall load capacitance. The present invention provides a method of reducing the overlap capacitance.

Figure 3A:
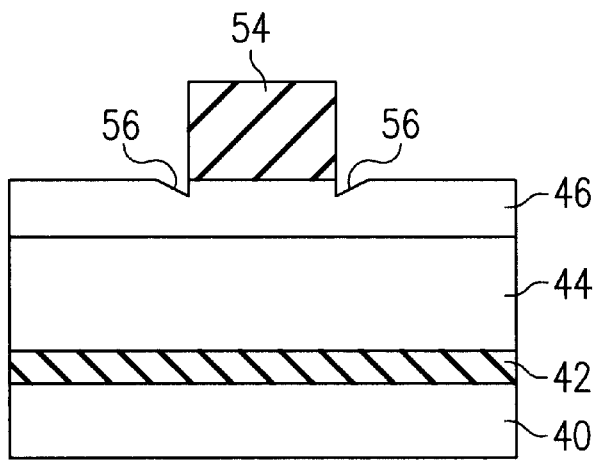
FIGS. 3A–3C represent a preferred embodiment method of the present invention.
Figure 3B:
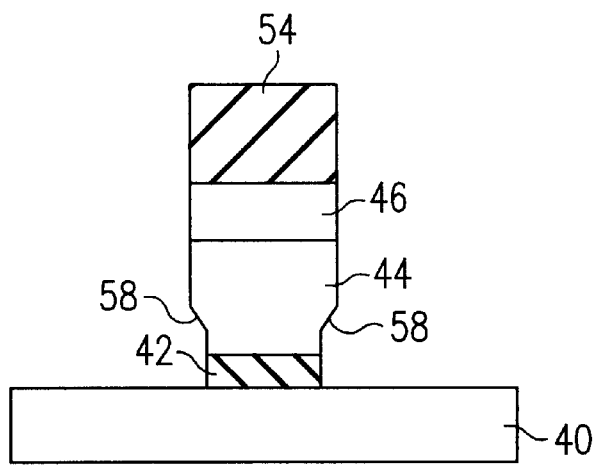
Figure 3C:
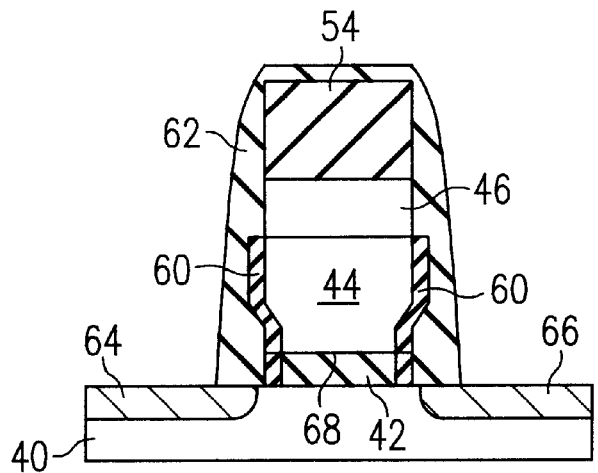

FIGS. 3A–3C represent a preferred embodiment method of the present invention. The preferred embodiment method comprises forming a dielectric substrate 40 and depositing a gate oxide layer 42 atop the dielectric substrate 40. The dielectric substrate 40 may be comprised of, for example, SILK or another low k dielectric material, but is preferably comprised of silicon. The gate oxide layer 42 is comprised of a thermally grown oxide layer or other well-known oxide deposition technique.

A conductive film layer 44 is deposited atop the gate oxide layer 42 and a metal silicide layer 46 is deposited over the conductive film layer 44. The deposition of the metal silicide layer 46 forms a conductive stack 48 that serves as a gate electrode. The conductive film layer 44 may be stoichiometric silicon nitride or plasma-deposited silicon nitride, but is preferably polycrystalline silicon (polysilicon). The metal silicide layer 46 increases the electrical conductivity and may be tantalum silicide but is preferably tungsten silicide. A patterned silicon nitride hard mask layer is then deposited over the metal silicide layer 46 and etched to leave a nitride hard mask 54 as shown in FIG. 3A. While prior art methods etch the hard mask layer down to the next underlying level, a preferred embodiment method of the present invention will over-etch the nitride hard mask 54. The over etching of the silicon nitride hard mask layer results in small notches 56 formed in the metal silicide layer 46 at each side of the nitride hard mask 54. These small notches 56 are generally to a depth of about 20 nm and the over-etching process typically lasts about five to about twenty seconds.

In one preferred embodiment method, the over-etching step is accomplished through reactive ion etching (RIE). As the silicon nitride hard mask layer is etched, the ions bouncing off the walls of the nitride hard mask layer as it is etched contact the metal silicide layer 46 to create the small notches 56 at each side of the nitride hard mask 54. The over-etching is controlled by a sensing mechanism (not shown) included as part of the machinery that performs the reactive ion etching. When the sensing mechanism detects a certain percentage of metal silicide layer 46 ions, the etching is discontinued.

Once the nitride hard mask 54 is over-etched down to the metal silicide layer 46, new chemistry is introduced to etch the metal silicide layer 46, conductive film layer 44, and the gate oxide layer 42. The etch of these layers results in indentions 58 which start at the conductive film layer 44 and continue through the gate oxide layer 42 as shown in FIG. 3B.

The unique resulting geometry of the etched gate stack is believed to be a result of the notches 56 formed when over-etching the silicon nitride hard mask layer. An oxide sidewall 60 is formed to encompass the conductive film and gate oxide layers, 44 and 42, and conforms to the shape of the indentions 58. This is illustrated in FIG. 3C. A nitride spacer 62 is also formed around the nitride hard mask 54, metal silicide layer 46, and conductive film layer 44. The structure at this point in the process contains a completed gate electrode.

The process continues with a source 64 and a drain 66 being implanted in the dielectric substrate 40. The implantation of the source 64 and drain 66 may also require an annealing process in which damage done to the dielectric substrate 40 is repaired. During implantation, the source 64 and drain 66 diffuse to produce some gate overlap between the gate electrode and each of the source 64 and drain 66. However, the indentions 58 in each side of the gate electrode results in decreased gate overlap between the gate electrode and the source 64 and drain 66 because the indentions 58 narrow the gate electrode at a base 68 thus decreasing the overlap capacitance. The decrease in gate capacitance is not at the expense of increasing other capacitance components of the overall load capacitance nor does the process of forming the indentions 58 require extra process steps. The base 68 of the gate electrode is narrowed about 10 to 20 nm on each side causing the overlap capacitance to be decreased about five to ten percent.

Figure 4A:
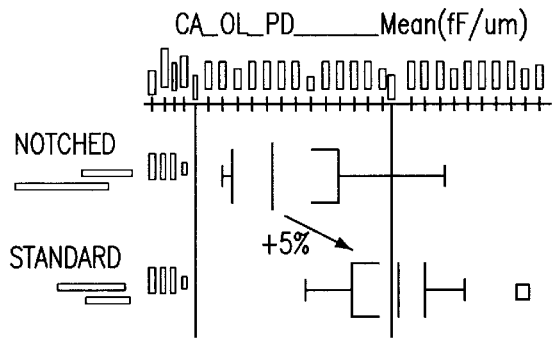
FIGS. 4A–4B represent gate overlay capacitance data for a preferred embodiment of the present invention.
Figure 4B:
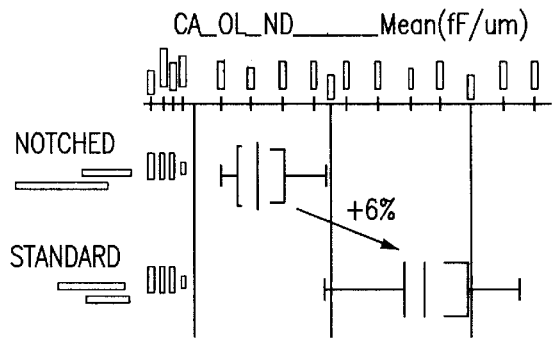
Figure 5A:
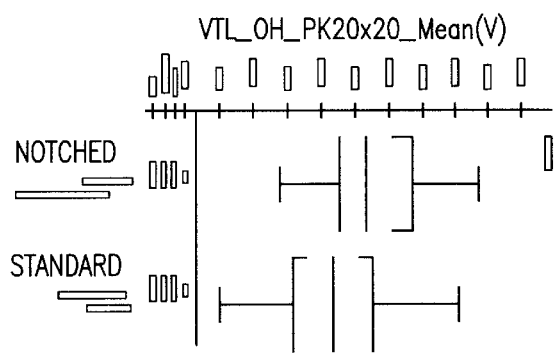
FIGS. 5A–5B represent VTL data for a preferred embodiment of the present invention.
Figure 5B:
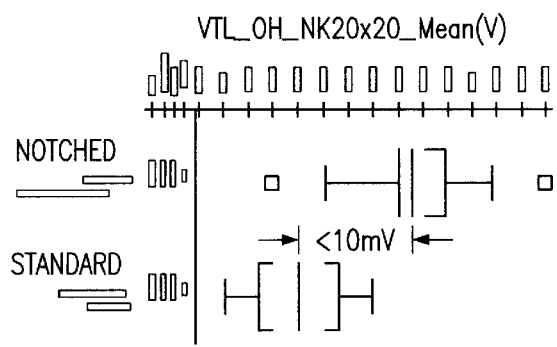
Figure 6A:
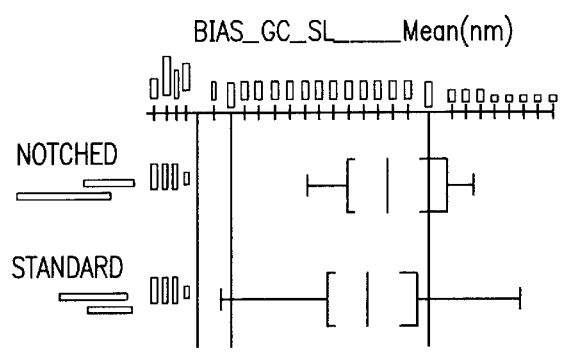
FIGS. 6A–6B represent gate bias data for a preferred embodiment of the present invention.
Figure 6B:
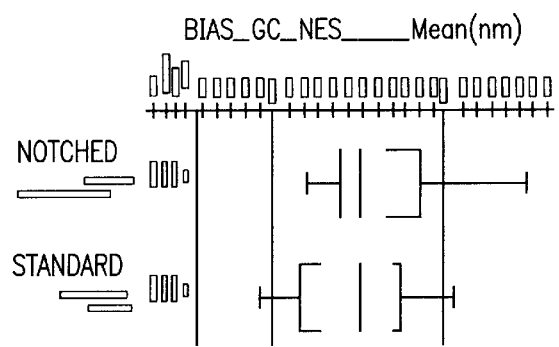

The difference in overlap capacitance is shown in FIGS. 4A and 4B which experimentally demonstrate the overlap capacitance in a split experiment performed on 0.20 μm eDRAM technology Field Effect Transistors (FETs). FIG. 4A demonstrates a conventional or standard gate and notched gate p MOSFET and FIG. 4B demonstrates a standard gate and notched gate n MOSFET. FIGS. 5A and 5B demonstrate the VTL of both standard gate and notched gate p- and n-MOSFETs showing a 10 mv difference between the notched and standard FETs in FIG. 5B, which is not significant. In FIGS. 6A and 6B, the difference in gate bias is demonstrated showing a significant difference in the gate bias between the notched and standard FETs.

The preferred embodiment method of the present invention discussed above results in a device having a dielectric substrate and a gate electrode having indentions formed in the gate electrode. A sidewall around a lower portion of the gate electrode and a spacer formed around the gate electrode are included. A source and drain electrode are formed in the dielectric substrate and have a decreased amount of overlap with the gate electrode.

In order to ensure that the extension regions will contact the channel when the notch width is large it is possible to perform the extension implants at an angle in a similar fashion to the HALO implant. The length of the base 68 of the gate is also reduced with respect to the top of the gate, which simultaneously allows for a T-like shape of the top of the gate that is desirable in order to reduce Gate sheet resistance. The shorter base 68 also allows for smaller devices and smaller gate capacitance without extra aggressive lithographic processing effort.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of producing a semiconductor device comprising:

forming a dielectric substrate;

depositing a gate oxide layer atop the dielectric substrate;

depositing a conductive film layer atop the gate oxide and a metal silicide layer over the conductive film layer, the deposition of the metal silicide layer forming a conductive stack;

depositing a patterned silicon nitride mask layer over the conductive stack;

over-etching the patterned silicon nitride mask layer whereby a notch is formed in the metal silicide layer at each side of the patterned silicon nitride mask layer;

etching the conductive stack down to the gate oxide layer, the notch at each side of the patterned silicon nitride mask layer causing indentions to form in the conductive stack at the sides of the conductive film layer;

forming an oxide sidewall, the oxide sidewall encompassing the conductive film and gate oxide layers, the oxide sidewall conforming to the shape of the indentions;

forming a spacer around the silicon nitride mask layer and conductive stack; and forming a source and a drain in the dielectric substrate;

whereby the indentions in the conductive stack result in decreased gate overlap between the gate and the source and drain.

2. The method of claim 1 wherein the dielectric substrate is comprised of silicon.

3. The method of claim 1 wherein the conductive film layer is comprised of polysilicon.

4. The method of claim 1 wherein the metal silicide layer is comprised of Tungsten.

5. The method of claim 1 wherein the over-etching is performed by reactive ion etching.

6. The method of claim 5 wherein the over-etching is accomplished in about five to about twenty seconds.

7. The method of claim 1 wherein the spacer is comprised of nitride.

8. The method of claim 1 wherein the forming of the source and drain precedes the forming of the spacer.

9. The method of claim 1 wherein the spacer is formed from an oxide.

* * * * *